(12) United States Patent
Kwon

(10) Patent No.: US 7,512,823 B2
(45) Date of Patent: Mar. 31, 2009

(54) SEMICONDUCTOR DEVICE WITH REDUCED POWER CONSUMPTION THAT SELECTIVELY DRIVES ONE OF A PLURALITY OF SIGNAL RECEIVERS ACCORDING TO LEVEL OF EXTERNAL SUPPLY VOLTAGE

(75) Inventor: Dae Han Kwon, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 465 days.

(21) Appl. No.: 11/109,270

(22) Filed: Apr. 19, 2005

(65) Prior Publication Data
US 2006/0139984 A1    Jun. 29, 2006

(30) Foreign Application Priority Data
Dec. 29, 2004    (KR) ............... 10-2004-0114771

(51) Int. Cl.
G06F 1/26    (2006.01)
(52) U.S. Cl. .................. 713/324; 327/62
(58) Field of Classification Search .......... 713/300, 713/324; 326/62
See application file for complete search history.

(56) References Cited

U.S. PATENT DOCUMENTS

| | | | | |
|---|---|---|---|---|
| 5,440,244 A | * | 8/1995 | Richter et al. | 326/37 |
| 6,034,550 A | * | 3/2000 | Takahashi | 326/81 |
| 6,393,510 B1 | * | 5/2002 | Lu | 710/305 |
| 6,756,815 B2 | * | 6/2004 | Van De Graaff | 326/82 |
| 6,801,061 B2 | * | 10/2004 | Cowles | 327/108 |

FOREIGN PATENT DOCUMENTS

| | | |
|---|---|---|
| KR | 1019970060209 | 8/1997 |
| KR | 1020040003339 | 1/2004 |

* cited by examiner

Primary Examiner—Thomas Lee
Assistant Examiner—Albert Wang
(74) Attorney, Agent, or Firm—Ladas & Parry LLP

(57) ABSTRACT

Disclosed is a semiconductor device capable of detecting levels of an external supply voltage, which includes a plurality of signal receivers for simultaneously receiving external input signals, wherein a driving voltage is applied to only one of the signal receivers according to the levels of the external supply voltage.

11 Claims, 4 Drawing Sheets

SEMICONDUCTOR DEVICE WITH REDUCED POWER CONSUMPTION THAT SELECTIVELY DRIVES ONE OF A PLURALITY OF SIGNAL RECEIVERS ACCORDING TO LEVEL OF EXTERNAL SUPPLY VOLTAGE

BACKGROUND OF THE INVENTION

1. Field of the Invention

The present invention relates to reduction of power consumption in a semiconductor device capable of selecting an external supply voltage.

2. Description of the Prior Art

One of the characteristics in most semiconductor devices having been recently designed is that various functions are provided to the semiconductor device for harmonization with an external system. The aforementioned semiconductor device is generally called a multifunctional semiconductor device. The reason for manufacturing the multifunctional semiconductor device as described above is because it is necessary to consider the situations of a market requiring a semiconductor device or a relation with a peripheral circuit of a system using a semiconductor device. For example, in a memory device, an option is provided so that a data width can be selected among X32, X16 and X8 or an external supply power can be selected between 1.8V and 2.5V.

However, in contrast with other options, when one of different external supply powers is selected and used in a semiconductor device, consumption power may become problematic.

This will be described in detail with reference to FIG. 1.

FIG. 1 is a block diagram schematically showing the general construction of a semiconductor device selecting and using one of different external supply powers.

As shown in FIG. 1, the semiconductor device basically includes a 1.8V dedicated block 11 and a 2.5V dedicated block 12. The 1.8V dedicated block 11 receives an external input signal and converts the received signal to an internal signal used in the semiconductor device when an external voltage is selected to be 1.8V. The 2.5V dedicated block 12 receives an external input signal and converts the received signal to an internal signal used in the semiconductor device when an external voltage is selected to be 2.5V. Herein, FIG. 1 shows only an example. Also, the voltage level of the external voltage may change according to the types of semiconductor devices and three or more types of external voltages may be applied to the semiconductor device. A signal selector 13 selects signals outputted from the 1.8V dedicated block 11 and the 2.5V dedicated block 12 and transfers the selected signals to the internal circuit. Further, the signal selector 13 is typically constructed by a circuit having a switching function like a multiplexer.

Hereinafter, the operation of the internal circuit shown in FIG. 1 will be described.

First, when an external supply voltage applied for operating the semiconductor device including the internal circuit shown in FIG. 1 is selected to be 1.8V, the 1.8V dedicated block 11 is selected. Accordingly, input signals applied to the semiconductor device are transferred to the signal selector 13 via the 1.8V dedicated block 11.

In contrast, when the external supply voltage is selected to be 2.5V, the 2.5V dedicated block 12 is selected. Accordingly, the input signals applied to the semiconductor device are transferred to the signal selector 13 via the 2.5V dedicated block 12.

However, in the prior art, as shown in FIG. 1, the 1.8V dedicated block 11 is operated by the supply power $V_{peri}$ and the ground voltage $V_{ss}$ and the 2.5V dedicated block 12 is operated by the external supply power VDD the ground voltage $V_{ss}$. Herein, the supply power $V_{peri}$ is an internal voltage generated when the semiconductor device is powered-up and the external supply power VDD is a voltage applied from an external of the semiconductor device.

By this reason, even after the 1.8V dedicated block 11 has been selected, the external supply power VDD the ground voltage $V_{ss}$ are supplied to the 2.5V dedicated block 12, thereby causing unnecessary power consumption.

Similarly, even after the 2.5V dedicated block 12 has been selected, the supply power $V_{peri}$ the ground voltage $V_{ss}$ are supplied to the 1.8V dedicated block 11, thereby causing unnecessary power consumption.

SUMMARY OF THE INVENTION

Accordingly, the present invention has been made to solve the above-mentioned problems occurring in the prior art, and it is an object of the present invention is to provide a solution for reducing power consumed in a semiconductor device by controlling a supply voltage applied to a 1.8V dedicated block and a supply voltage applied to a 2.5V dedicated block.

It is another object of the present invention is to provide a solution for reducing power consumed in a semiconductor device by selectively switching a supply voltage applied to a 1.8V dedicated block and a supply voltage applied to a 2.5V dedicated block.

In order to achieve the above objects, according to one aspect of the present invention, there is provided a semiconductor device capable of detecting levels of an external supply voltage, the semiconductor device comprising: a plurality of signal receivers for simultaneously receiving external input signals, wherein a driving voltage is applied to only one of the signal receivers according to the levels of the external supply voltage.

In the present invention, the driving voltage is a supply voltage or a ground voltage. Further, in the present invention, levels of the supply voltage applied to each of the signal receivers are different from each other.

In order to achieve the above objects, according to one aspect of the present invention, there is provided a semiconductor device capable of detecting levels of an external supply voltage, the semiconductor device comprising: an external power detector for detecting the levels of the external supply voltage; a plurality of switches controlled by the external power detector and connected to a plurality of driving voltages; and a plurality of signal receivers connected to the switches, for simultaneously receiving external input signals.

In the present invention, only some of the switches are turned on according to the voltage levels of the external supply voltage, and the driving voltages are applied to only some of the signal receivers connected to the switches having been turned on.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings.

Figure 2:
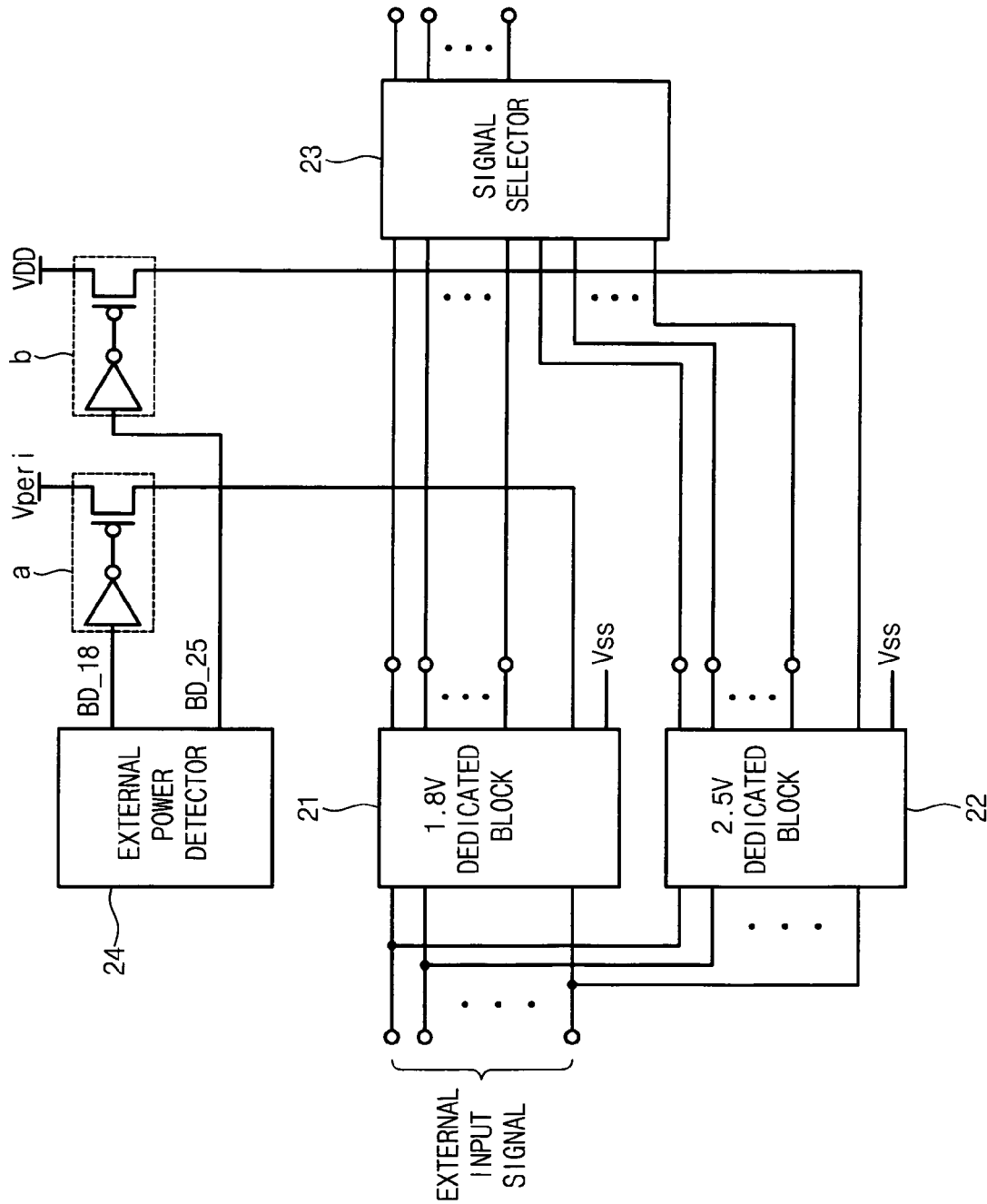
FIG. 2 is a block diagram showing a semiconductor device with reduced power consumption according to a first embodiment of the present invention.

FIG. 2 is a block diagram showing a semiconductor device according to a first embodiment of the present invention.

Figure 1:
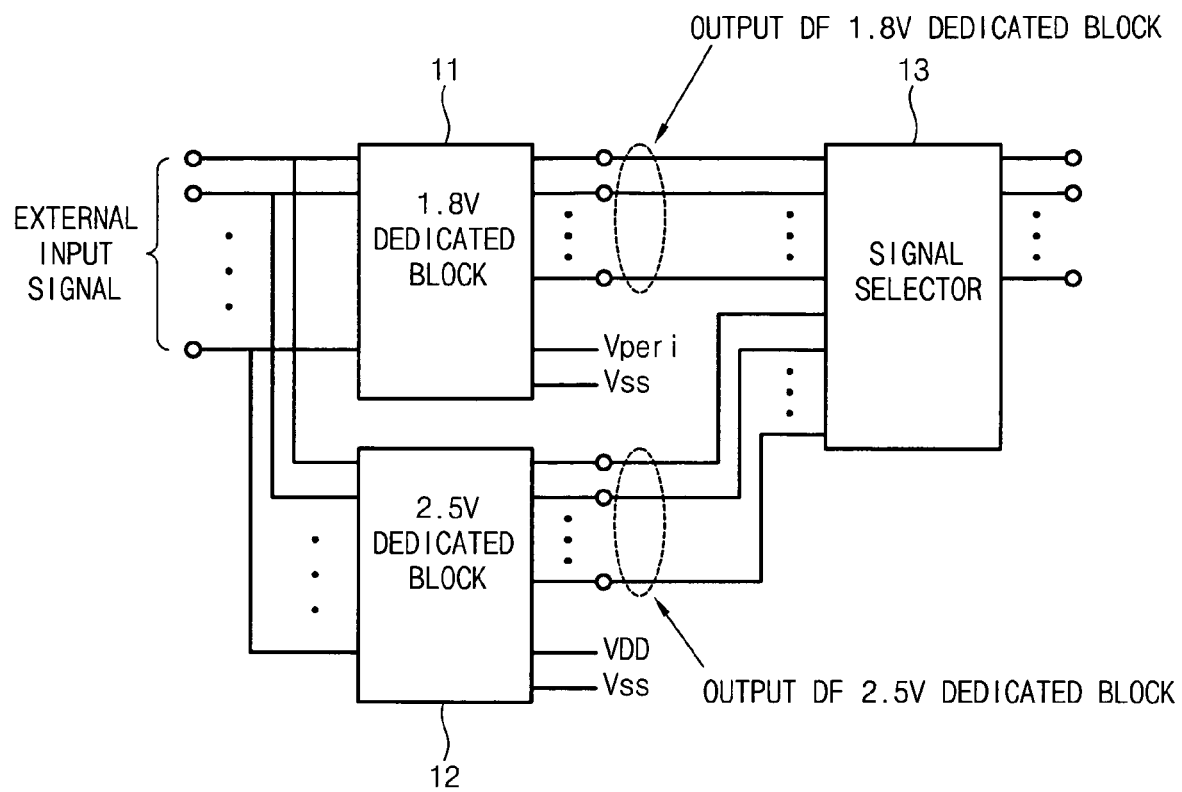
FIG. 1 is a block diagram schematically showing the general construction of a semiconductor device selecting and using one of different external supply powers.

The semiconductor device shown in FIG. 2 includes a 1.8V dedicated block 21, a 2.5V dedicated block 22, an external power detector 24, and switches a and b. A signal selector 23 selects signals outputted from the 1.8V dedicated block 21 or the 2.5V dedicated block 22 and transfers the selected signals to the internal circuit. Further, the signal selector 23 is equal to the signal selector 13 of FIG. 1.

The 1.8V dedicated block 21 is a circuit element for receiving signals applied from an exterior after an external supply voltage supplied to the semiconductor device has been selected to be 1.8V, and uses the supply voltage $V_{peri}$ and the ground voltage $V_{ss}$ as a driving voltage. Herein, the supply voltage $V_{peri}$ represents a voltage generated in the semiconductor device when the external supply voltage has been supplied to the semiconductor device, that is, the semiconductor device is powered up.

The 2.5V dedicated block 22 is a circuit element for receiving signals applied from the exterior after the external supply voltage supplied to the semiconductor device has been selected to be 2.5V, and uses the supply voltage VDD and the ground voltage $V_{ss}$ as a driving voltage. Herein, the supply voltage VDD represents the external supply voltage applied to the semiconductor device. For example, when the external supply voltage is 1.8V, the supply voltage VDD is 1.8V. Further, when the external supply voltage is 2.5V, the supply voltage VDD is 2.5V.

In Principle, the 1.8V dedicated block 21 and the 2.5V dedicated block 22 described above have functions of a signal receiver for receiving the signals applied from the exterior and a buffer.

The external power detector 24 is a circuit element for determining whether the external supply power is 1.8V or 2.5V.

First, when the external supply power is 1.8V, the switch a is turned on by the output signal BD_18 of the external power detector 24 and the switch b maintains an off state. When the switch a is turned on, the supply voltage $V_{peri}$ connected to the switch a is supplied to the 1.8V dedicated block 21. Since the 1.8V dedicated block 21 is connected to the ground voltage $V_{ss}$ when the semiconductor device is powered up, the 1.8V dedicated block 21 normally operates after the supply of the supply voltage $V_{peri}$. In such a case, the switch b is turned off, the supply voltage VDD necessary for operating the 2.5V dedicated block 22 is not applied to the 2.5V dedicated block 22. Therefore, it is possible to block power consumed in the 2.5V dedicated block 22.

Next, when the external supply power is 2.5V, the switch b is turned on by the output signal BD_25 of the external power detector 24 and the switch a maintains an off state. When the switch b is turned on, the supply voltage VDD connected to the switch b is supplied to the 2.5V dedicated block 22. Since the 2.5V dedicated block 22 is connected to the ground voltage $V_{ss}$ when the semiconductor device is powered up, the 2.5V dedicated block 22 normally operates after the supply of the supply voltage VDD. In such a case, the switch a is turned off, the supply voltage $V_{peri}$ necessary for operating the 1.8V dedicated block 21 is not applied to the 1.8V dedicated block 21. Therefore, it is possible to block power consumed in the 1.8V dedicated block 21.

Figure 3:
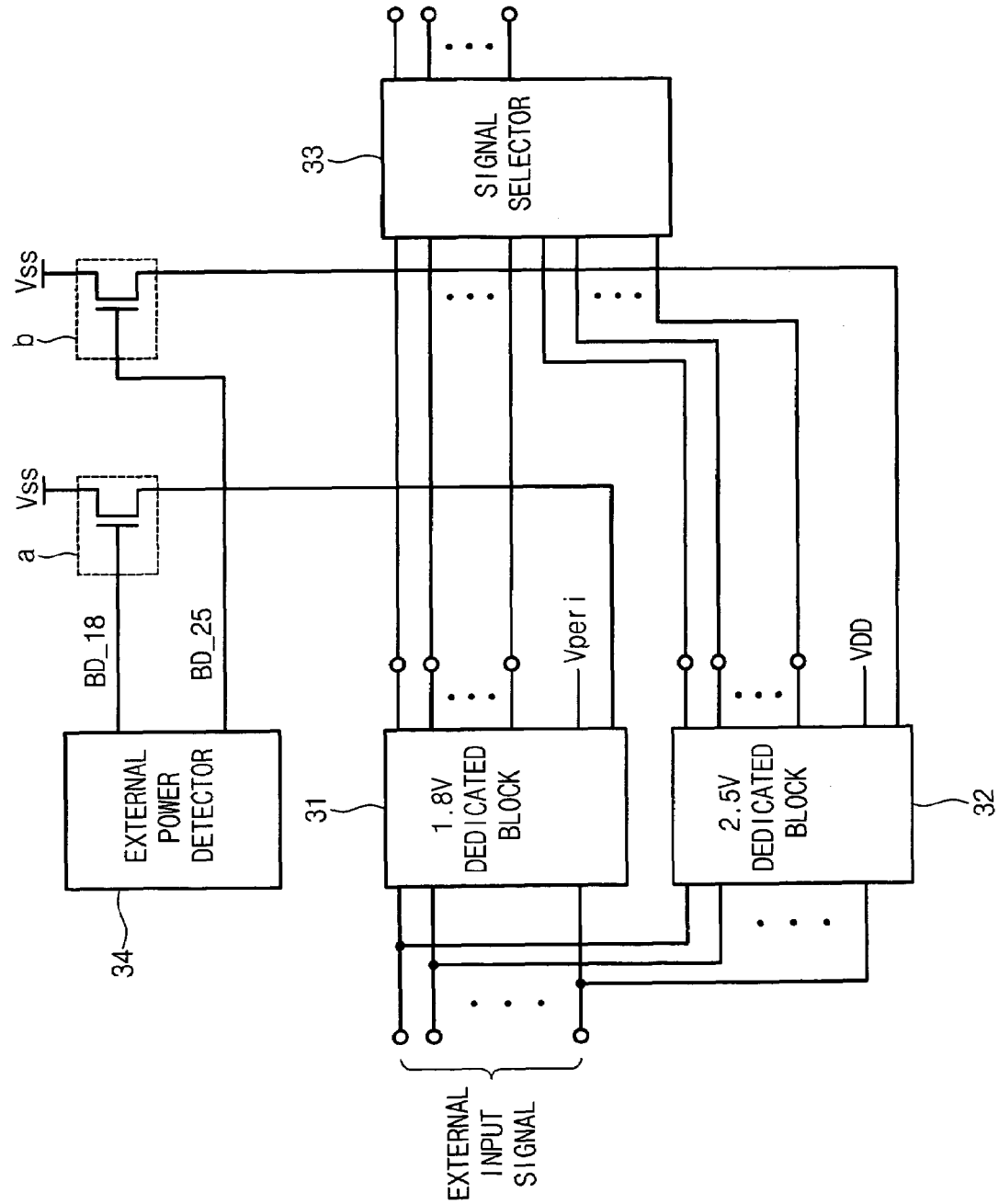
FIG. 3 is a block diagram showing a semiconductor device with reduced power consumption according to a second embodiment of the present invention.

FIG. 3 is a block diagram showing a semiconductor device according to a second embodiment of the present invention.

An external power detector 34, a 1.8V dedicated block 31, a 2.5V dedicated block 32, and a signal selector 33 of FIG. 3 basically have the same operations and functions as those of the external power detector 24, the 1.8V dedicated block 21, the 2.5V dedicated block 22, and the signal selector 23 of FIG. 2.

First, when the external supply power is 1.8V, a switch a is turned on by the output signal BD_18 of the external power detector 34 and a switch b maintains an off state. When the switch a is turned on, the ground voltage $V_{ss}$ connected to the switch a is supplied to the 1.8V dedicated block 31. Since the 1.8V dedicated block 31 is connected to the supply voltage $V_{peri}$ when the semiconductor device is powered up, the 1.8V dedicated block 31 normally operates after the supply of the ground voltage $V_{ss}$. In such a case, the switch b is turned off, the ground voltage $V_{ss}$ necessary for operating the 2.5V dedicated block 32 is not applied to the 2.5V dedicated block 32. Therefore, it is possible to block power consumed in the 2.5V dedicated block 32.

Next, when the external supply power is 2.5V, the switch b is turned on by the output signal BD_25 of the external power detector 34 and the switch a maintains an off state. When the switch b is turned on, the ground voltage $V_{ss}$ connected to the switch b is supplied to the 2.5V dedicated block 32. Since the 2.5V dedicated block 32 is connected to the supply voltage VDD when the semiconductor device is powered up, the 2.5V dedicated block 32 normally operates after the supply of the ground voltage $V_{ss}$. In such a case, the switch a is turned off, the ground voltage $V_{ss}$ necessary for operating the 1.8V dedicated block 31 is not applied to the 1.8V dedicated block 31. Therefore, it is possible to block power consumed in the 1.8V dedicated block 31.

Figure 4:
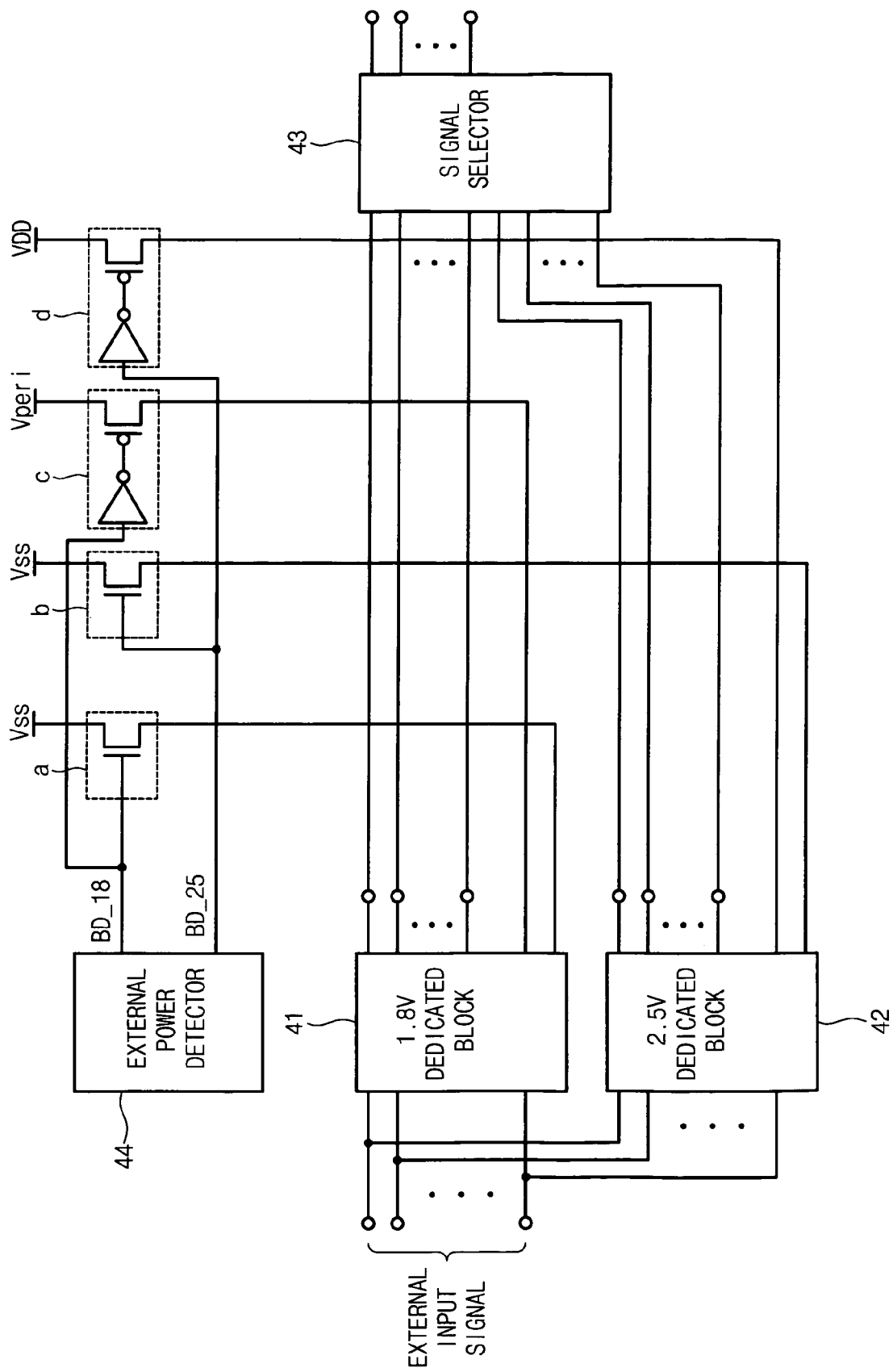
FIG. 4 is a block diagram showing a semiconductor device with reduced power consumption according to a third embodiment of the present invention.

FIG. 4 is a block diagram showing a semiconductor device according to a third embodiment of the present invention.

An external power detector 44, a 1.8V dedicated block 41, a 2.5V dedicated block 42, and a signal selector 43 of FIG. 4 basically have the same operations and functions as those of the external power detector 24, the 1.8V dedicated block 21, the 2.5V dedicated block 22, and the signal selector 23 of FIG. 2.

First, when the external supply power is 1.8V, switches a and c are turned on by the output signal BD_18 of the external power detector 44 and switches b and d maintain off states. When the switches a and c are turned on, the ground voltage $V_{ss}$ and the supply voltage $V_{peri}$ respectively connected to the switches a and c are supplied to the 1.8V dedicated block 41. The 1.8V dedicated block 41 normally operates after the supply of the ground voltage $V_{ss}$ and the supply voltage $V_{peri}$. In such a case, the switches b and d are turned off, the ground voltage $V_{ss}$ and the supply voltage VDD necessary for operating the 2.5V dedicated block 42 are not applied to the 2.5V dedicated block 42. Therefore, it is possible to block power consumed in the 2.5V dedicated block 42.

Next, when the external supply power is 2.5V, the switches b and d are turned on by the output signal BD_25 of the external power detector 44 and the switches a and c maintain off states. When the switches b and d are turned on, the ground voltage $V_{ss}$ and the supply voltage VDD respectively connected to the switches b and d are supplied to the 2.5V dedicated block 42. The 2.5V dedicated block 42 normally operates after the supply of the ground voltage $V_{ss}$ and the supply voltage VDD. In such a case, the switches a and c are turned off, the supply voltage $V_{ss}$ and the supply voltage $V_{peri}$ necessary for operating the 1.8V dedicated block 41 is not applied to the 1.8V dedicated block 41. Therefore, it is possible to block power consumed in the 1.8V dedicated block 41.

Power consumption of the semiconductor devices can be reduced by employing the semiconductor devices according to the present invention as described above. Accordingly, the semiconductor devices according to the present invention are very proper for mobile products requiring low power.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A semiconductor device capable of detecting levels of an external supply voltage, the semiconductor device comprising:
    a plurality of signal receivers for simultaneously receiving external input signals,
        wherein each signal receiver requires a corresponding one of a plurality of driving voltages for driving the signal receiver and wherein each driving voltage is dedicated only to the corresponding signal receiver, and
    wherein only one of the plurality of driving voltages is applied to the corresponding signal receiver and the driving voltage to be applied to the corresponding signal receiver is selected according to the level of the external supply voltage such that only one of the driving voltages is selectively applied to only the corresponding signal receiver, and the remaining driving voltages are not supplied to their respective signal receivers and wherein each signal receiver receives only the driving voltage dedicated to the signal receiver.

2. The semiconductor device as claimed in claim 1, wherein the driving voltage applied to each of the signal receivers is a supply voltage or a ground voltage.

3. The semiconductor device as claimed in claim 2, wherein levels of the supply voltage applied to each of the signal receivers are different from each other.

4. The semiconductor device as claimed in claim 1, wherein the driving voltage applied to each of the signal receivers is a supply voltage and a ground voltage, and the supply voltage and the ground voltage are applied to the corresponding signal receiver only when the driving voltage is selected according to the level of the external power supply.

5. The semiconductor device as claimed in claim 4, wherein levels of the supply voltage applied to each of the signal receivers are different from each other.

6. The semiconductor device as claimed in claim 1, wherein each of the signal receivers simultaneously receives a plurality of the external input signals, and the signal receiver which receives the driving voltage converts the plurality of received signals using the driving voltage to a plurality of internal signals.

7. A semiconductor device capable of detecting levels of an external supply voltage, the semiconductor device comprising:
    a plurality of driving voltages;
    an external power detector for detecting the levels of the external supply voltage and outputting output signals which are enabled according to the level of the external supply voltage;
    a plurality of switches each receiving one of the output signals, wherein one or more of the switches are connected to each of the driving voltages, such that the switches are controlled by the external power detector and are switched on by the output signals such that the driving voltages are supplied according to the level of the external power supply voltage; and
    a plurality of signal receivers connected to the switches, for simultaneously receiving external input signals, wherein the signal receivers are connected to corresponding switches based on the required driving voltage of the signal receiver, such that the driving voltages are applied to their respective signal receivers depending upon the respective switches controlled in response to the output signals which are enabled according to the level of the external supply voltage.

8. The semiconductor device as claimed in claim 7, wherein only some of the switches are turned on by the external power detector according to the voltage levels of the external supply voltage, and the driving voltages are applied to only some of the signal receivers connected to the switches having been turned on.

9. The semiconductor device as claimed in claim 8, wherein the driving voltage is a supply voltage or a ground voltage.

10. The semiconductor device as claimed in claim 9, wherein levels of the supply voltage applied to each of the signal receivers are different from each other.

11. The semiconductor device as claimed in claim 7, wherein only one of the plurality of signal receivers receives a corresponding one of the plurality of driving voltages according to the level of the external supply voltage, and the external power detector turns on only the switches corresponding to the only one signal receiver.

* * * * *